United States Patent [19]

Kasugai

[11] Patent Number: 4,746,865
[45] Date of Patent: May 24, 1988

[54] METHOD AND SYSTEM FOR MAGNETIC RESONANCE IMAGING

[75] Inventor: Takao Kasugai, Ootawara, Japan

[73] Assignee: Kabushiki Kaisha Toshiba, Kawasaki, Japan

[21] Appl. No.: 925,233

[22] Filed: Oct. 31, 1986

[30] Foreign Application Priority Data

Nov. 2, 1985 [JP] Japan .................. 60-247798

[51] Int. Cl.⁴ ............................. G01R 33/20
[52] U.S. Cl. ...................... 324/309; 324/307
[58] Field of Search ............ 324/300, 307, 312, 313, 324/309, 318, 322; 128/653

[56] References Cited

U.S. PATENT DOCUMENTS 3,873,909  3/1975  Ernst ..................... 324/312
4,070,708  1/1978  Smallcombe ............ 324/307

Primary Examiner—Michael J. Tokar
Attorney, Agent, or Firm—Foley & Lardner, Schwartz, Jeffery, Schwaab, Mack, Blumenthal & Evans

[57] ABSTRACT

A magnetic resonance imaging system has an excitation section, a signal collecting section, a first image processor, a maximum value detector, a threshold setting section, and a second image processor. The excitation section applies predetermined magnetic fields to a patient to excite a magnetic resonance phenomenon therein. The signal collecting section collects magnetic resonance signals produced by the magnetic resonance phenomenon. The first image processor obtains original image pixel data representing the distribution of magnetic resonance data, from the magnetic resonance signals. The maximum value detector detects the maximum amplitude value in original image pixel data. The threshold setting section sets a threshold value in accordance with the maximum amplitude value. The second image processor performs predetermined arithmetic processing using original image pixel data having an amplitude exceeding the threshold value, to thereby obtain processed image data from the original image pixel data.

9 Claims, 6 Drawing Sheets

F I G. 4
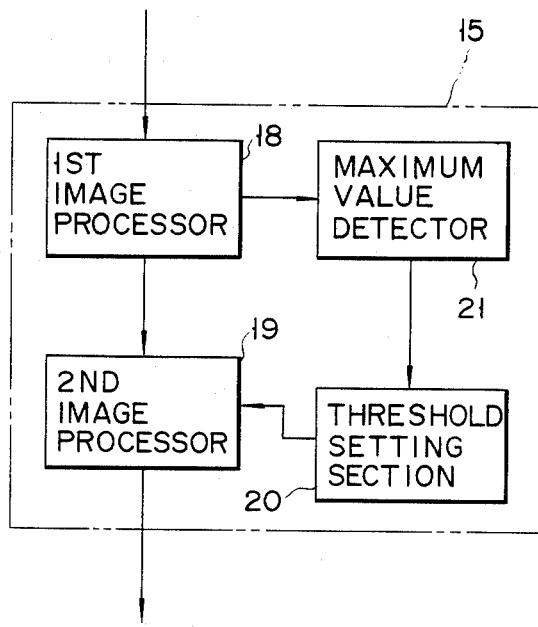

METHOD AND SYSTEM FOR MAGNETIC RESONANCE IMAGING

BACKGROUND OF THE INVENTION

The present invention relates to a magnetic resonance imaging (MRI) system which causes an object under examination to undergo a magnetic resonance (MR) phenomenon, detects an MR signal based on the MR phenomenon, and performs processing including image reconstruction for the detected data, thereby obtaining MR image data representing the distribution of MR data in a selected slice of the object, e.g., the density of a specific nuclear spin and/or relaxation time constant, and the like. More particularly, the invention relates to a method and system for MRI for performing a predetermined arithmetic operation with the plurality of MR images to calculate another MR image.

In an MRI system, an object to be examined is placed in a uniform static magnetic field, a gradient field is superposed on the uniform magnetic field, and an excitation rotating field is applied to the object in the magnetic field, thus causing an MR phenomenon in a prospective slice portion of the object. An MR signal caused by the MR phenomenon is detected, and is subjected to predetermined processing including image reconstruction, thus obtaining slice data which reflects MR data in the slice of the object. The MRI system is widely used as a medical diagnosis system.

An imaging operation in a conventional MRI system will now be briefly described with reference to FIG. 1.

Object P to be examined (i.e., a patient) is placed in a sufficiently uniform static magnetic field H0, along a z axis in FIG. 1. Static magnetic field H0 is generated by a magnetic field generator (not shown). Linear magnetic gradient Gz is applied to static magnetic field H0 by a pair of gradient field coils 1A and 1B. Coils 1A and 1B comprise, e.g., a pair of Helmholtz coils. A magnetic field intensity distribution in which a magnetic field intensity differs in accordance with the displacement along the z axis is obtained by magnetic gradient Gz along the z axis. Specific nuclei resonate with respect to static magnetic field H0 at angular frequency $\omega 0$ given by the following relation:

$$\omega 0 = \gamma H0$$

Where $\gamma$ is a magnetogyric ratio, which is inherent to each type of nuclei.

Excitation rotating field H1 at a radio frequency of angular frequency $\omega 0$ (generally, angular frequency $\omega 0$ is a radio frequency (RF)) which can resonate only specific nuclei is applied to patient P from a probe head. Since excitation rotating field H1 is applied not continuously for a long period of time but is applied in the form of pulses, it is called an excitation pulse. The probe head has a pair of transmission coils 2A and 2B comprising saddle coils, as shown in FIG. 1. Excitation pulse H1 is applied to patient P through coils 2A and 2B.

When excitation pulse H1 is applied, an MR phenomenon occurs only in slice portion S (which is a planar portion but has a given thickness in practice) selectively determined by magnetic gradient Gz along the z axis. Slice portion S is perpendicular to the z axis, as shown in FIG. 1. The MR phenomenon is detected as an MR signal by the probe head. The probe head also comprises a pair of reception coils 3A and 3B comprising saddle coils, as shown in FIG. 1, and the MR signal is detected by these coils 3A and 3B.

The MR signal detected by coils 3A and 3B is either a free induction decay (FID) signal or a spin echo signal. Which signal the coils 3A and 3B detect depends on the MR excitation method (or excitation pulse sequence) employed. In order to obtain a slice image consisting of MR data, two-dimensional position data on the plane of slice portion S is necessary. For this reason, to add the two-dimensional position data to the MR signal, magnetic gradient Gxy having gradients in various directions on the x-y plane is applied to field H0 by coils or the like (not shown) after slice portion S is excited to cause the MR phenomenon. The thus detected MR signal is subjected to predetermined processing, e.g., two-dimensional Fourier transformation, thereby reconstructing a slice image consisting of the MR data in slice portion S.

The obtained MR data does not separately include specific nuclear (e.g., hydrogen nuclear) density $\rho$, longitudinal relaxation time T1, and transverse relaxation time T2 (i.e. parameters inherent to the tissue of the patient P) as the MR data, but rather as a combination thereof. When a predetermined arithmetic operation is performed using MR images which are located at an identical position, have the same thickness, and satisfy predetermined conditions among MR images directly obtained from the MR signal, then one can obtain pure longitudinal and transverse relaxation times T1 and T2 and specific nuclear density $\rho$ or a parameter image as an arbitrary combination of these parameters.

For example, a case will be described wherein an MR image is obtained from a spin echo signal by a spin echo method.

An MR original image obtained by the spin echo method, i.e., a spin echo image, includes specific nuclear density $\rho$, longitudinal relaxation time T1, transverse relaxation time T2 as parameters inherent to tissue, and repetition time TR (repetition cycle of a series of MR excitation - echo collection sequence) and echo time TE (an interval from when an excitation pulse is applied until a spin echo is observed) as parameters of imaging conditions, i.e., collecting conditions of MR (spin echo) signals. Specific nuclear density $\rho$, longitudinal relaxation time T1, and transverse relaxation time T2 as the parameters inherent to tissue are constant regardless of the imaging conditions, and repetition time TR and echo time TE as the parameters of the imaging conditions vary in accordance with the imaging conditions. For this reason, when an arithmetic operation is made using a plurality of spin echo images having different repetition times TR and echo times TE, parameter images for specific nuclear density $\rho$, longitudinal relaxation time T1, and transverse relaxation time T2 can be respectively obtained.

For example, as shown in FIG. 2, two spin echo images SE1 and SE2 are obtained when repetition time TR=2,000 msec and echo time TE=40 msec and of repetition time TR=2,000 msec and echo time TE=80 msec. Thus, parameter image PT of transverse relaxation time T2 can be calculated using these images SE1 and SE2.

When parameter image PT of transverse relaxation time T2 is formed by calculation using images SE1 and SE2, if calculation is simply made for each pixel, the value of a pixel which must have "0" is sometimes not "0" but an abnormal value. This is caused by background noise or an artifact of the image data during spin echo collecting process and/or spin echo image formation process.

In the conventional apparatus, as a countermeasure against this problem, a threshold value is set for data values of images, i.e., values for each pixel (gray levels), and pixels having values lower than the threshold value are set to have value "0".

With this method, however, since the threshold value is set based on experience, collected image data has a poor S/N. In particular, when the image data value of a background portion is large, the abnormal value of the background portion remains without being suppressed. In contrast to this, when the image data value is small, necessary image data may often be erased.

SUMMARY OF THE INVENTION

It is an object of the present invention to provide a method and system for MRI which can effectively remove abnormal background values of a calculated image obtained by calculation using an MR original image (obtained directly from collected MR signals), and can obtain an MR calculated image with high image quality.

An MRI system of the present invention has an excitation section, a signal collecting section, a first image processor, a maximum value detector, a threshold setting section, and a second image processor. The excitation section applies predetermined magnetic fields to an object to be examined (patient) to cause an MR phenomenon. The signal collecting section collects MR signals produced by the MR phenomenon. The first image processor obtains original image data representing the distribution of MR data from the MR signals. The maximum value detector detects a maximum value in pixel data. The threshold setting section sets a threshold value in accordance with the detected maximum values. The second image processor performs a predetermined arithmetic operation using the image data of the original image data exceeding the threshold value, thereby obtaining processed image data from the original image data.

According to the MRI system of the present invention, a high-quality MR calculated image from which an adverse influence of noise or artifact is removed can be obtained.

BRIEF DESCRIPTION OF THE DRAWINGS

FIG. 4 is a block diagram showing an image processing section in the system shown in FIG. 3 in detail;

DETAILED DESCRIPTION OF THE PREFERRED EMBODIMENTS

An MRI system according to an embodiment of the present invention will now be described with reference to the accompanying drawings.

Figure 3:
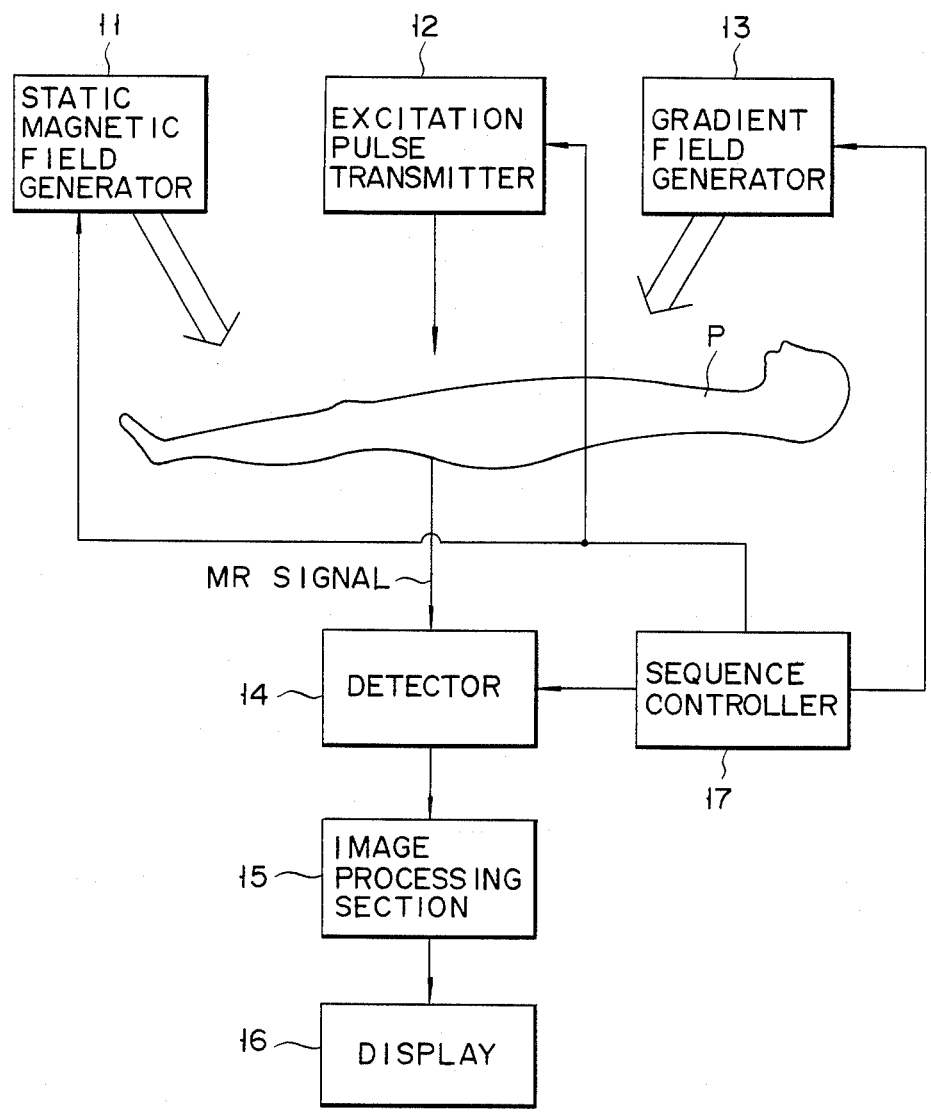
FIG. 3 is a block diagram showing the arrangement of an MRI system according to an embodiment of the present invention.

An MRI system according to the embodiment of the present invention comprises static magnetic field generator 11, excitation pulse transmitter 12, gradient field generator 13, detector 14, image processing section 15, display 16, and sequence controller 17, as shown in FIG. 3.

Static magnetic field generator 11 generates static magnetic field H0 applied to patient P. Gradient field generator 13 generates a gradient field superposed on static magnetic field H0. Excitation pulse transmitter 12 applies an excitation pulse to patient P in order to cause an MR phenomenon in patient P.

Detector 14 collects MR signals, e.g., spin echo signals, based on the MR phenomenon excited in patient P. Image processing section 15 fetches the MR signals to form an MR image, in this case, a spin echo image, of patient P and, at the same time to form parameter images for longitudinal relaxation time T1, transverse relaxation time T2, and the like. Display 16 displays the MR image obtained by section 15 as a visible image.

Sequence controller 17 shown in FIG. 3 controls generator 11, transmitter 12, generator 13, and detector 14 in accordance with a predetermined sequence for realizing a predetermined pulse sequence.

Image processing section 15 comprises first image processor 18, second image processor 19, threshold setting section 20, and maximum value detector 21, as shown in FIG. 4.

First image processor 18 fetches the MR signals, i.e., the spin echo signals, to form a spin echo image, and stores it therein. Maximum value detector 21 detects the maximum value of pixel values of the spin echo image obtained by first image processor 18. Threshold setting section 20 sets a threshold value corresponding to a predetermined ratio, e.g., 10% or 15%, of the maximum value based on the maximum value detected by detector 21. The predetermined ratio is a preset value predetermined in accordance with the S/N of the detected MR signals. In this embodiment, the threshold value is set to be 15% of the maximum value. Second image processor 19 fetches the spin echo image obtained by processor 18, and forms parameter images for relaxation times T1, T2, and the like through an arithmetic operation in which unnecessary image components below the threshold value in the spin echo image are ignored.

Figure 1:
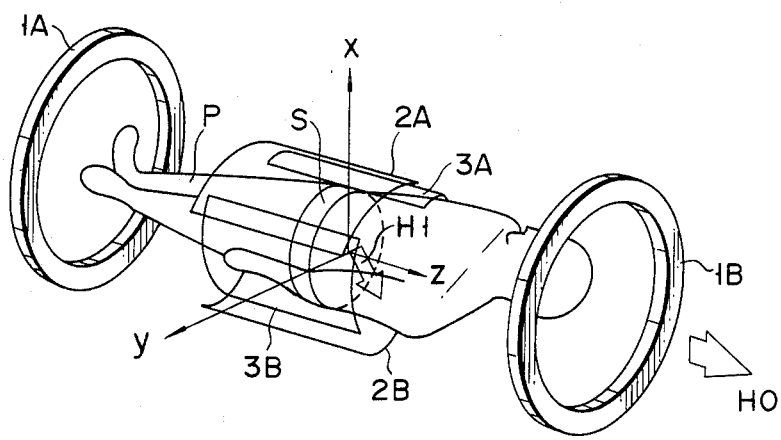
FIG. 1 is an illustration for explaining the principle of MRI.
Figure 2:
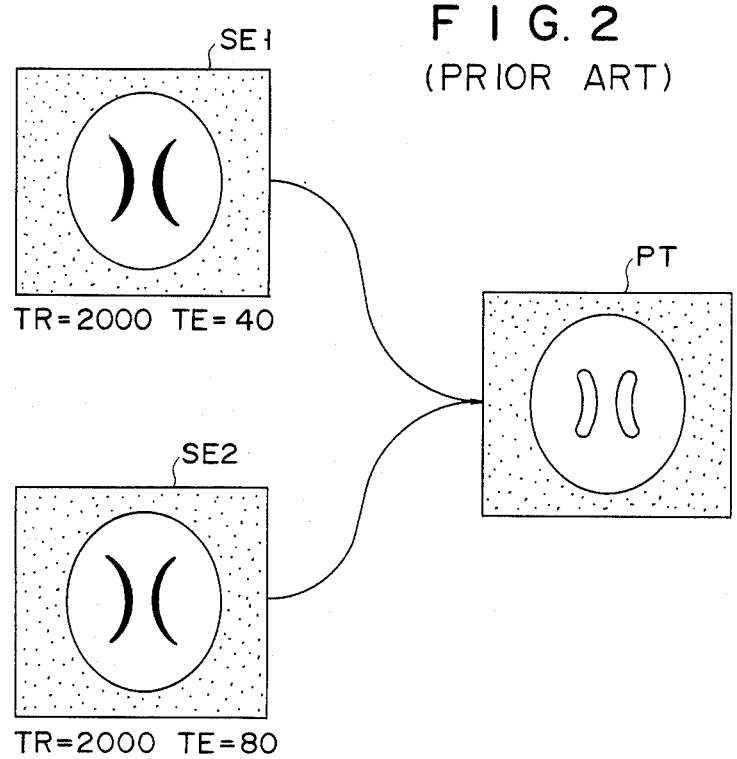
FIG. 2 is an illustration for explaining that a parameter image is calculated from two spin echo images.
Figure 5:
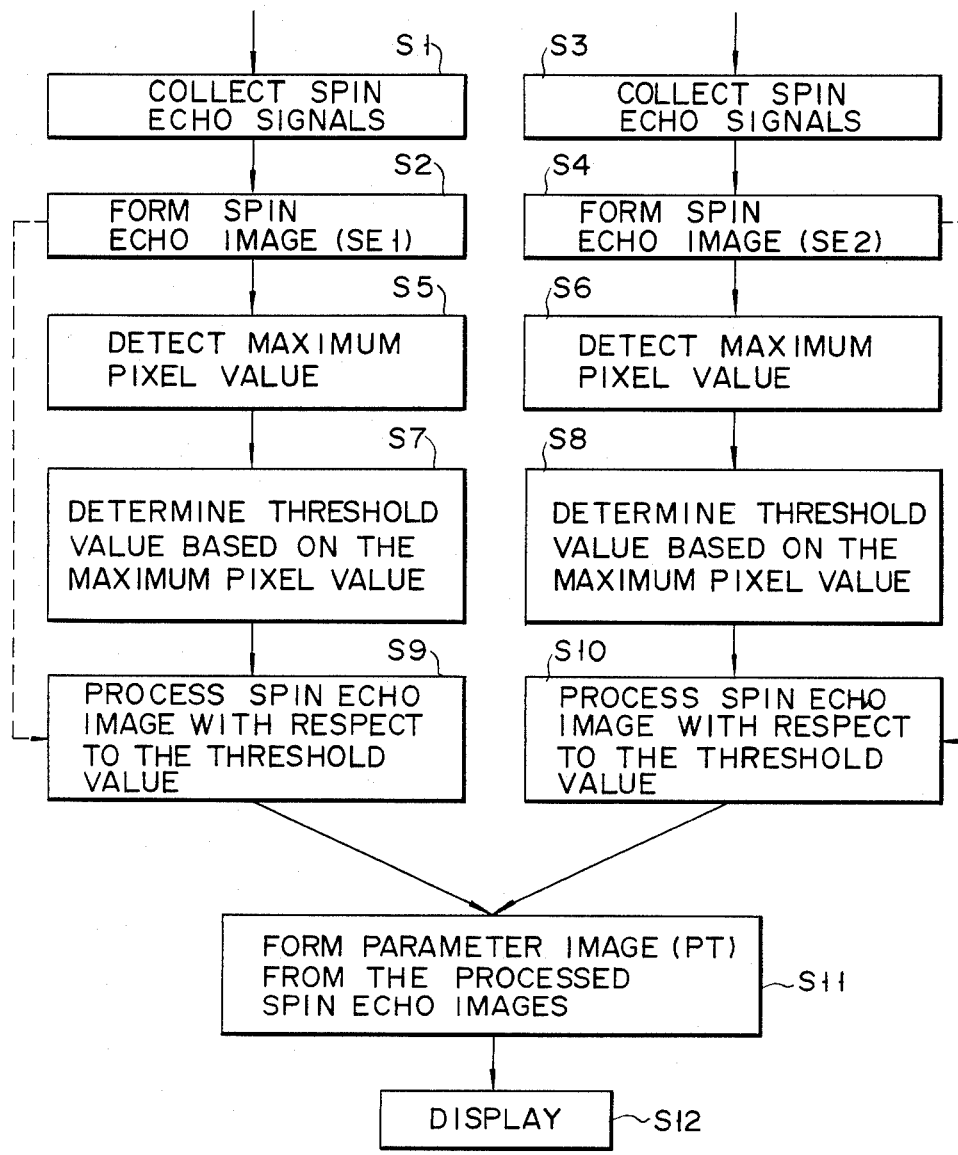
FIG. 5 is a flow chart showing a sequence of forming a parameter image in the system shown in FIG. 3.
Figure 6:
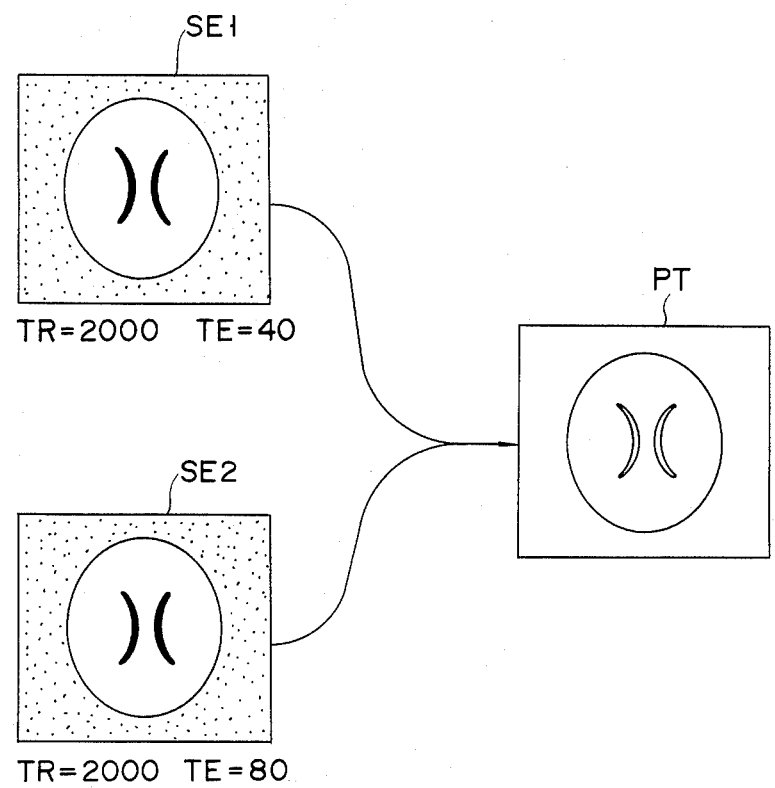
FIG. 6 is an illustration for explaining that a parameter image is calculated from two spin echo images in the system shown in FIG. 3.

The detailed operation of the MRI system will now be described with reference to FIGS. 5 and 6. Note that FIG. 5 is a flow chart showing the processing sequence. Spin echo signals SE1 and SE2 shown in FIG. 6 are the same as those shown in FIG. 2.

An operator first sets imaging parameters, i.e., repetition time TR=2,000 msec and echo time TE=40 msec, and drives sequence controller 17. Generator 11, transmitter 12, and generator 13 are driven in accordance with the pulse sequence of, e.g., a pulse echo method under the preset conditions, thus exciting an MR phenomenon in patient P.

The MR signals, i.e., the spin echo signals, produced by the MR phenomenon are collected by detector 14 (S1). The collected spin echo signals are fetched by first image processor 18 and are subjected to predetermined processing, thus forming spin echo image SE1. Spin echo image SE1 is temporarily stored in image processor 18 (S2).

The operator then updates the imaging parameters, i.e., repetition time TR=2,000 msec and echo time TE=80 msec, thus operating the system. The spin echo signals are collected in the same manner as described above (S3), and spin echo image SE2 is formed by processor 18 and is temporarily stored therein (S4).

The maximum values of the pixels constituting spin echo images SE1 and SE2 are detected by detector 21 (S5, S6), respectively. The maximum values of the pixels of spin echo images SE1 and SE2 are supplied to threshold setting section 20 to set threshold values corresponding to 15% of the maximum values (S7, S8). Spin echo images SE1 and SE2 are fetched by second image processor 19. They are subjected to the arithmetic operation based on the threshold values, so that pixel values corresponding to image data values below the threshold values as unnecessary components are suppressed to zero (S9, S10). In processor 19, an arithmetic operation for obtaining a predetermined parameter image is performed using the processed spin echo images (i.e., intermediate images), thus calculating parameter image PT for transverse relaxation time T2, in this case, (S11). Parameter image PT can be a high-quality parameter image from which background noise or artifact is removed, as illustrated in FIG. 6.

Parameter image PT is displayed on display 16 (S12).

The present invention is not limited to the above embodiment, and various changes and modifications may be made within the spirit and scope of the invention.

For example, in the above embodiment, a parameter image for transverse relaxation time T2 is formed from two spin echo images. However, parameter images for longitudinal relaxation time T1, specific nuclear density $\rho$, and the like, or a combination thereof can be formed in the same manner as described above.

The ratio of the threshold value to the maximum pixel value is not limited to 15% or 10%, but can be an appropriate value in accordance with the S/N of an MR original image.

The ratio of the threshold value to the maximum pixel value can be selected by an operator.

Figure 7:
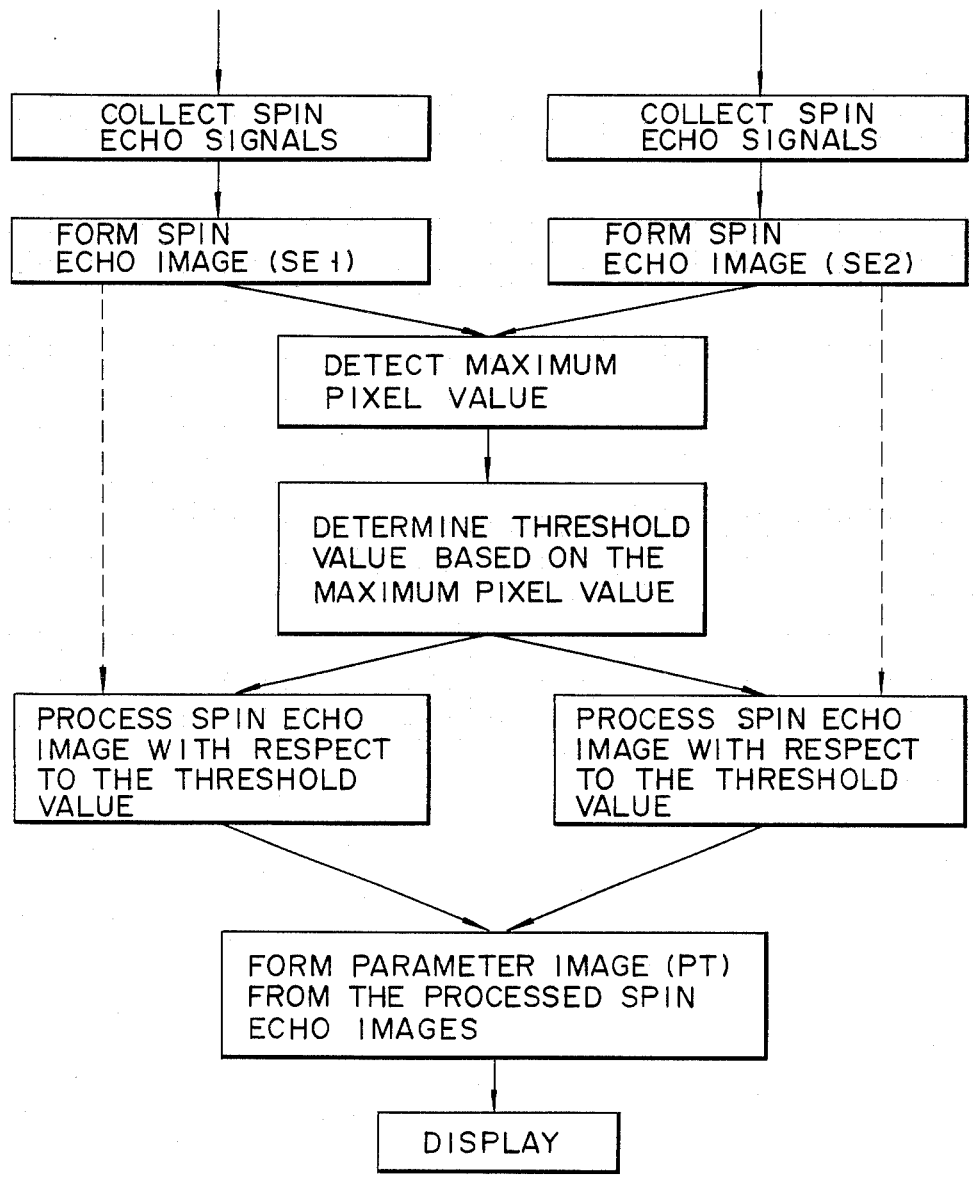
FIG. 7 is a flow chart showing a sequence of forming a parameter image in an MRI system according to another embodiment of the present invention.

In the flow chart shown in FIG. 5, maximum value detection processing and threshold value setting processing by means of detector 21 and section 20 are independently performed for each spin echo image. Alternatively, as shown in FIG. 7, maximum value detection processing can be performed for all the spin echo images, and a threshold value determined by the maximum value can be commonly used for all the spin echo images.

As a matter of course, the present invention is not limited to the MR image processing using the spin echo method, but can be applied to a system for obtaining a processed image, e.g., a parameter image, by a calculation using a plurality of MR original images obtained by other methods, e.g., a selective excitation method.

What is claimed is:

1. A magnetic resonance imaging method comprising the steps of:
    (a) applying predetermined magnetic fields to an object to cause a magnetic resonance phenomenon therein;
    (b) collecting magnetic resonance signals produced by the magnetic resonance phenomenon;
    (c) obtaining original image pixel data representing a distribution of magnetic resonance data from the magnetic resonance signals obtained in the collecting step;
    (d) detecting a maximum amplitude value of the original image pixel;
    (e) setting a threshold value in accordance with said maximum amplitudes value; and
    (f) performing arithmetic processing using said original image pixel data exceeding in amplitude the threshold value to obtain processed image data.

2. A method according to claim 1, wherein the threshold setting step includes setting the threshold value corresponding to a predetermined ratio of the maximum amplitude value.

3. A method according to claim 1, wherein step (f) includes obtaining intermediate image pixel data by suppressing image pixel data below the threshold value and by using only image pixel data exceeding the threshold value and performing said arithmetic processing using said intermediate image pixel data to obtain said processed image data.

4. A method according to claim 1, further comprising the step of displaying an image corresponding to the processed image data.

5. A magnetic resonance imaging system comprising:
    excitation means for applying predetermined magnetic fields to an object to excite a magnetic resonance phenomenon therein;
    signal collecting means for collecting magnetic resonance signals produced by the magnetic resonance phenomenon excited by said excitation means;
    first image processing means for obtaining original image pixel data representing a distribution of magnetic resonance data from the magnetic resonance signals collected by said signal collecting means;
    maximum value detection means for detecting a maximum amplitude value for the original image pixel data;
    threshold setting means for setting a threshold value in accordance with the maximum amplitude value obtained by said maximum value detection means; and
    second image processing means for performing arithmetic processing using said original image pixel data having an amplitude which exceeds the threshold value to obtain processed image data.

6. A system according to claim 5, wherein said threshold setting means includes means for multiplying said maximum amplitude value by a predetermined coefficient to calculate said threshold value.

7. A system according to claim 5, wherein said second image processing means includes first means for obtaining intermediate image pixel data by suppressing original image pixel data having an amplitude below said threshold value, and second means for performing said arithmetic processing using the intermediate image pixel data to obtain the processed image data.

8. A system according to claim 5, further comprising display means for displaying the processed image data.

9. A system according to claim 5, wherein said excitation means includes means for exciting a magnetic resonance phenomenon including a spin echo, and said signal collecting means includes means for collecting spin exho signals as the magnetic resonance signals.

* * * * *